(12) United States Patent
Raychaudhuri et al.

(10) Patent No.: US 6,558,820 B2
(45) Date of Patent: May 6, 2003

(54) HIGH CONTRAST LIGHT-EMITTING DIODE DEVICES

(75) Inventors: Pranab K. Raychaudhuri, Rochester, NY (US); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 35 days.

(21) Appl. No.: 09/852,956

(22) Filed: May 10, 2001

(65) Prior Publication Data

US 2003/0035978 A1 Feb. 20, 2003

(51) Int. Cl.[7] .......................... H05B 33/22; C09K 11/00
(52) U.S. Cl. ...................... 428/690; 428/917; 313/502; 313/504; 313/506; 427/66
(58) Field of Search ................................. 428/690, 917; 313/502, 504, 506; 427/66

(56) References Cited

U.S. PATENT DOCUMENTS

| 4,720,432 A | | 1/1988 | VanSlyke et al. |
| 4,769,292 A | | 9/1988 | Tang et al. |
| 4,885,211 A | | 12/1989 | Tang et al. |
| 5,645,948 A | | 7/1997 | Shi et al. |
| 5,917,280 A | * | 6/1999 | Burrows et al. ............ 313/506 |
| 5,935,721 A | | 8/1999 | Shi et al. |
| 6,020,078 A | | 2/2000 | Chen et al. |
| 6,278,236 B1 | * | 8/2001 | Madathil et al. ............ 313/504 |
| 6,307,528 B1 | * | 10/2001 | Yap ............................. 345/45 |

OTHER PUBLICATIONS

"Bright Organic Electroluminescent Devices Having a Metal–Doped Electron–Injecting Layer", by Junji Kido, Applied Physics letters, vol. 73, No. 20, Nov. 16, 1998, pp. 2866–286.
"Orgaic Electroluminescent Diodes" by C. W. Tang et al., Applied Physics Letter 51 (12) Sep. 21, 1987, pp. 913–915.
"A Low Reflectivity Multilayer Cathode for Organic Light–Emitting Diodes", by O. Renault et al., Thin Solid Films 379 (2000) 195–198, pp. 195–198.
"EL Displays Show Sunlight Readability Advantage" by C. Chinnock, Military & Aerospace Electronics, Jun. 4, 1998.

* cited by examiner

Primary Examiner—Cynthia H. Kelly
Assistant Examiner—Dawn Garrett
(74) Attorney, Agent, or Firm—Raymond L. Owens

(57) ABSTRACT

An OLED device including a substrate, an anode formed of a conductive material over the substrate, and an emissive layer having an electroluminescent material provided over the anode. The OLED device also includes either an ultrathin cathode over the emissive layer, a thin interlayer over the ultrathin cathode and a reflecting layer over the thin interlayer, or the thin interlayer over the emissive layer and a reflecting layer containing an electron-injecting dopant over the thin interlayer.

24 Claims, 3 Drawing Sheets

HIGH CONTRAST LIGHT-EMITTING DIODE DEVICES

CROSS REFERENCE TO RELATED APPLICATIONS

Reference is made to commonly assigned U.S. patent application Ser. No. 09/577,092 now U.S. Pat. No. 6,429,451 filed May 24, 2000; 09/379,776 now U.S. Pat. No. 6,394,870 filed Aug. 24, 1999 entitled "Reduction of Ambient-Light-Reflection in Organic Light-Emitting Devices" by Liang-Sun Hung et al.; the disclosure of which is incorporated herein by reference.

FIELD OF THE INVENTION

The present invention relates to organic light-emitting diode devices and in particular to high contrast devices and methods for making such devices.

BACKGROUND OF THE INVENTION

Organic electroluminescent (OEL) device, alternately known as organic light emitting diode (OLED), is useful in flat-panel display applications. This light-emissive device is attractive because it can be designed to produce red, green, and blue colors with high luminance efficiency; it is operable with a low driving voltage of the order of a few volts and viewable from oblique angles. These unique attributes are derived from a basic OLED structure comprising of a multilayer stack of thin films of small-molecule organic materials sandwiched between a hole-injecting and an electron-injecting layers. Tang et al in U.S. Pat. Nos. 4,769,292 and 4,885,211 has disclosed such a structure. The most common electroluminescent (EL) medium comprises a bi-layer structure of a hole-transport (HTL) layer and an emissive and electron-transport layer (EML/ETL), typically of the order of a few tens of nanometer thick for each layer. The anode, or the hole-injecting electrode, is usually an optically transparent indium tin oxide (ITO) glass, which also serves as the substrate for the OLED. A low-work function metallic layer is selected as cathode, or electron-injecting electrode for the device. The device emits visible light in response to a potential difference applied across the EL medium. The light is emitted in all directions. A fraction of light that strikes the cathode surface is reflected and directed toward the anode. This adds to the intensity of light passed through the ITO glass. High reflectivity cathode is thus preferred as it helps to enhance the brightness of emission. However, highly reflective cathode also reflects significant amount of ambient light that enters the device through ITO glass. At high illumination level the reflected ambient light can overpower the EL emission causing an apparent degradation of emitted light. To an observer the emitted light visually perceived washed out. Increasing the ambient illumination increases the washed out appearance and lowers the visual contrast. In many applications, particularly in outdoors or in brightly illuminated room, visual contrast may be more important than the intensity of emission. In quite a few applications it is required that the displays can be viewed rather easily under a variety of ambients ranging from total darkness to full sunlight. One of the ways of achieving an enhancement of visual contrast is by reducing the reflection from cathode.

A well-known approach to reduce glare is to use polarizers, particularly circular polarizers on the outside surface of transparent substrate. However, this requires an additional bonding step incompatible to the OLED fabrication process adding significant cost. Furthermore, polarizers significantly reduce the emitted light intensity.

Another approach disclosed by Luxell Technologies (Journal of Military and Aerospace Electronics, Vol 9, No 6, June 1998) yielded inorganic light-emitting (EL) displays with reduced glare and enhanced sunlight readability. An optically tuned interference structure is interposed between the shiny back electrode and phosphor material in the EL stack. This interference structure termed as the "sunshine legible black layer" consists of vacuum deposited layers of absorbing and dielectric materials. This technology produced displays with 14% reflectance.

In another approach an n-type oxygen-deficient semiconductor layer of $ZnO_{1-x}$ was used as the interference tuning layer and laid over an ultra thin LiF/Al bi-layer cathode. The structure of the device was ITO/NPB/Alq/LiF/Al/85 nm $ZnO_{1-x}$/Al. This device also exhibited greatly reduced reflectivity relative to a standard device.

Often, the reflection reducing materials require that for minimization of reflectivity, the thickness of the interference tuning layers be of the order of 100 nm. Fabrication of these types of structures necessarily requires long deposition time. It is also clear that to prepare the interference-tuning layer with reproducible and predictable optical properties the deposition parameters for these types of materials have to be tightly controlled. Furthermore, these devices may also be potentially unstable in the long term. Thermodynamic data suggest that Al can reduce $ZnO_{1-}$. The $Al_2O_3$ that is likely to form at the $ZnO_{1-}$/Al interface can degrade the operating voltage of the device. No stability data of those devices were reported.

Renault et al (O. Renault, O. V. Salata, M M. Chells, P. J. Dobson, V. Christou) in Thin Solid Films 379 (2000) 195–198 describe a low reflectivity multilayer cathode that shows promise for contrast improvements in OLEDs. The device structure incorporates a light absorbing carbon film between a thin semitransparent electron-injecting layer of Mg and a top Al layer. The reflectivity of low reflectivity cathode was 58% at 550 nm. The standard cathode comprised of Al:Mg (10:1) exhibited a reflectivity of ~100% at 550 nm. The current-voltage properties of the two devices were almost identical. Although a lower reflectivity is needed for contrast improvements, the contrast also depends on the emitted light intensity and ambient illumination. Their reported values of EL intensities at 22 eV for standard and low reflectivity devices were 130 $Cd/m^2$ and 68 $Cd/m^2$, respectively. Following their definition of contrast and using the reported reflectivity and luminance values, no increase of contrast over that of the standard

SUMMARY OF THE INVENTION

It is therefore an object of the present invention to provide a novel OLED device having higher display contrast arising from reduced reflection from the reflecting layer.

It is another object of the present invention to provide an improved OLED device having higher display contrast arising from reduced reflection from the reflecting layer wherein an interlayer is used in the device structure.

It is another an object of the present invention to provide an improved OLED device having higher display contrast arising from reduced reflection from the reflecting layer wherein in the interlayer material is a semi-metal, metal, or intermetallic compound or alloys thereof.

It is further an object of the present invention to provide an improved OLED device having higher display contrast arising from reduced reflection from the reflecting layer wherein in the interlayer is very thin.

The objects are achieved by an OLED device for providing increased contrast, comprising:

a) a transparent substrate;

b) an anode formed of a transparent conductive material over the substrate;

c) an emissive layer having an electroluminescent material provided over the anode layer;

d) an ultrathin low absorption electron-injecting layer laid over the electron-transport layer;

e) an interlayer including a semi-metal, metal, metal alloy or an intermetallic compound disposed over the ultrathin low absorption electron-injecting layer;

f) a layer of reflective material provided over the interlayer; and g) wherein the interlayer thickness is selected to cause an increase in contrast.

This object is further achieved by an OLED device for providing increased contrast, comprising:

a) a transparent substrate;

b) an anode formed of a transparent conductive material over the substrate;

c) an emissive layer formed over the substrate and including an electroluminescent material;

d) an interlayer provided over the emissive layer including a semi-metal, metal, metal alloy or an intermetallic compound;

e) a layer of reflective material provided over the interlayer; and f) wherein the reflective layer is doped with an electron-injecting dopant which migrates sufficiently to provide an electron-injecting connection between the reflecting layer and the emissive layer and wherein the interlayer thickness is selected to cause an increase in contrast.

An advantage of the present invention is that an OLED device has significantly reduced ambient-light reflection from the device and substantially increased contrast compared to devices having no interlayer but otherwise similar in structure.

Another advantage of the present invention is that OLED devices of the present invention have a very thin and conducting interlayer.

DETAILED DESCRIPTION OF THE EMBODIMENTS

Throughout the ensuring description acronyms are used to designate the names of different layers and operating features of organic light-emitting diode devices. For reference, they are listed in Table 1.

TABLE 1

| OLED | Organic light-emitting diode |
|---|---|
| ITO | Indium tin oxide |
| HIL | Hole-injection layer |
| HTL | Hole-transport layer |

TABLE 1-continued

| EML | Emissive layer |
|---|---|
| ETL | Electron-transport layer |
| NPB | 4,4'-Bis[N-(l-naphthyl)-N-phenylamino]biphenyl (NPB) |
| Alq | Tris(8-hydroxyquinoline) aluminum |
| LiF | Lithium Fluoride |
| Al | Aluminum |
| Y | Yttrium |
| Ge | Germanium |
| Ag | Silver |

Figure 1A:
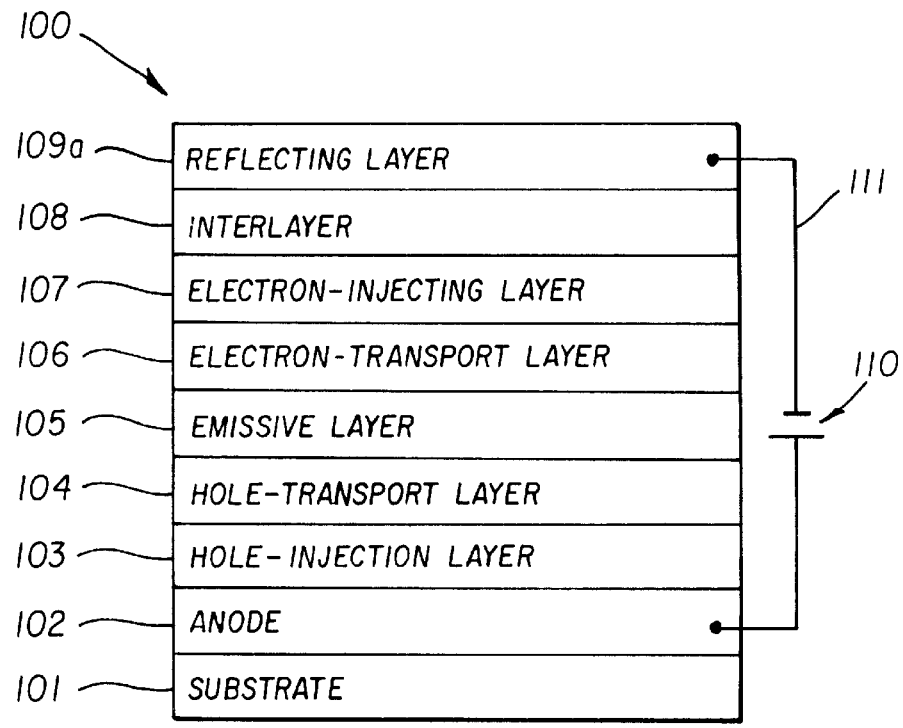
FIGS. 1a and 1b show schematically the layer structure of different embodiments of OLED devices made in accordance with the present invention.
Figure 1B:
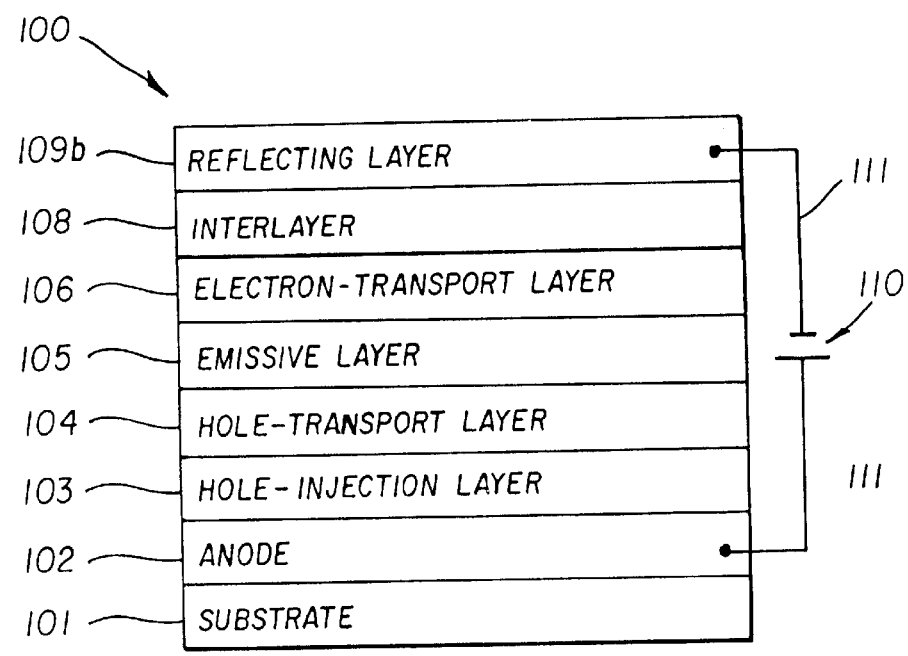

Turning now to FIG. 1a and FIG. 1b, the OLED device 100 of this invention comprises a transparent substrate 101, a transparent anode 102, a hole-injection layer (HIL) 103, a hole transport layer (HTL) 104, an emissive layer (EML) 105, an electron-transport layer (ETL) 106, an interlayer (IL) 108, and a reflective layer 109a or 109b. The interlayer 108 preferably includes a semiconductor metal, metal, metal alloy, or an intermetallic compound disposed over the ultrathin low absorption electron-injecting layer. The interlayer thickness is selected to cause an increase in contrast. In the embodiment of FIG. 1a, an electron-injecting layer 107 (hereinafter referred to as the cathode layer) is provided over the ETL layer. In the embodiment of FIG. 1b the reflective layer 109b contains an electron-injecting element that diffuses to the surface of ETL providing electron injection. With respect to the FIG. 1a embodiment, it has been determined that the cathode layer preferably is ultrathin and has a thickness in the range of 0.2 to 10 nm. In operation, the anode and the reflective layer that is in electrical connection to the cathode layer are connected to a voltage source 110 via conductors 111 allowing electrical current through the organic layers, resulting in light emission or electroluminescence from the OLED device. The electroluminescence can be viewed from the substrate side. The intensity of the electroluminescence is dependent on the magnitude of the electrical current that is passed through the OLED device 100, which in turn is dependent on the luminescent and electrical characteristics of the organic layers as well as the charge-injecting nature of the contacting electrodes.

The composition and the function of the various layers constituting the OLED device are described as follows:

Substrate 101 may include glass, ceramic, or plastics. Since the OLED device fabrication does not require high temperature process, any substrate that can withstand process temperatures of the order of 100° C. is useful, which includes most thermal plastics. The substrate may take the form of rigid plate, flexible sheet, or curved surfaces. Substrate 101 may include support with electronic backplane, and thus includes active-matrix substrates, which contain electronic addressing and switching elements. Examples of such active-matrix substrates include substrates with high-temperature polysilicon thin-film-transistors, substrates with low-temperature polysilicon thin-film-transistors, substrates with amorphous silicon transistors, or any substrates with thin-film-transistor. Those skilled in the art will appreciate that other circuit elements can be used to address and drive the OLED devices.

Anode 102 provides the function of injecting hole into the organic layer when a positive potential relative to the cathode layer is applied to the OLED. It has been shown, for example in U.S. Pat. No. 4,720,432, that indium tin oxide (ITO) forms excellent anode because it has a relatively high work function. Since ITO film itself is transparent, ITO coated glass provides an excellent support for the fabrication of OLED devices. Other suitable anode materials include thin films of high work function metals such as Au, Pt, Pd, or alloys of these metals.

Hole-injecting layer (HIL) 103 provides the function of increasing the efficiency of the hole injection from the anode into the organic layers. It has been shown, for example in U.S. Pat. No. 4,885,211, that a porphorinic or phthalocyanine compound is useful as a hole injection layer, resulting in increased luminance efficiency and operational stability. Other preferred HIL materials include CFx which is a fluorinated polymer deposited by plasma-assisted vapor deposition, wherein x is less than or equal to 2 and greater than 0. The method of preparation and the characteristics of CFx have been disclosed in commonly-assigned U.S patent application Ser. No. 09/186,538 filed November 5, entitled "Organic Electroluminescent Device With a Non-Conductive Fluorocarbon Polymer" by Hung et al, the disclosure of which is incorporated herein.

Hole transport layer (HTL) 104 provides the function of transporting holes to the emissive layer (EML) 105. HTL materials include various classes of aromatic amines as disclosed in commonly assigned U.S. Pat. No. 4,720,432. A preferred class of HTL materials includes the tetraaryldiamines of formula (I).

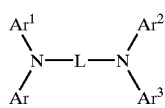
(I)

wherein:
Ar, $Ar^1$, $Ar^2$ and $Ar^3$ are independently selected from among phenyl, biphenyl, and naphthyl moieties;
L is a divalent naphthalene moiety or $d_n$
d is a phenylene moiety;
n is an integer of from 1 to 4; and
at least one of Ar, $Ar^1$, $Ar^2$ and $Ar^3$ is a naphthyl moiety.

Illustrative of useful selected (fused aromatic ring containing) aromatic tertiary amines are the following:
4,4'-Bis[N-(1-naphthyl)-N-phenylamino]biphenyl (NPB)
4,4''-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthalene
2,6-Bis[di-(1-naphtyl)amino]naphthalene Emissive layer 105 of FIG. 1a and FIG. 1b provides the function of light emission produced as a result of recombination of holes and electrons in this layer. A preferred embodiment of the emissive layer comprises a host material doped with one or more fluorescent dyes. Using this host-dopant composition, highly efficient OLED devices can be constructed. The reflective layer 109b must be doped with an electron-injecting dopant which migrates sufficiently to provide an electron-injecting connection between the reflecting layer 109b and the emissive layer 105 and wherein the interlayer thickness is selected to cause an increase in contrast. It will be understood that, although reflective layer 109a does not have be doped, it could also be doped. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for OLED devices using Alq as the host material. As set forth in the Tang et al. U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; and alkyl substituted 9,10 dinaphthyl anthracene, as disclosed in Shi et al. U.S. Pat. No. 5,935,721.

Dopant materials include most fluorescent and phorphorescent dyes and pigments. Preferred dopant materials include coumarins such as coumarin 6, dicyanomethylenepyrans such as 4-dicyanomethylene-4H pyrans, as disclosed in Tang et al. U.S. Pat. No. 4,769,292 and in Chen et al. in U.S. Pat. No. 6,020,078.

Electron-transport layer 106 of FIG. 1a provides the function of delivering electrons injected from the cathode layer 107 to the emissive layer 105. Useful materials include Alq and benzazoles as disclosed in Shi et al. U.S. Pat. No. 5,645,948.

The cathode layer 107 of FIG. 1a includes an electron-injecting bilayer element such as LiF/Al. A single-layer of low-work function metal or a low-work function alloy such as Mg:Ag, see C. W. Tang and S. A. VanSlyke, Appl. Phys. Lett. 51, 913 (1987), or a Li doped surface of an electron-transport layer can also provide efficient electron injection, see Junji Kido and Toshio Matsumoto, Appl. Phys. Lett. 73, 2866(1998), to the ETL layer. The cathode layer 107 (see FIG. 1a) has a work function between 2 and 4 eV. To optically interact with the interlayer 108, the cathode layers should preferably be of high optical transmittance.

The interlayer 108, includes electrically conductive semi-transparent layers of semimetals, intermetallic compound or alloys thereof such as Ge, Se, GeTe, W, Mo, or Ta. The required layer thickness for minimization or reflectivity is usually thin which is benefical from a fabrication point view.

The reflective layers 109a of FIG. 1a and 109b of FIG. 1b are preferably highly reflective and conducting. These include metals like Ag, Al, Au, and Cu and alloys having one or more of these metals as a major component. The reflective layer 109b of FIG. 1b must additionally contain an electron-injecting dopant capable of resulting in an electron-injecting contact to the ETL layer. Such dopant metals preferably include alkaline and alkaline earth metals but, in any event, should have materials that have a work function between 2 and 4 eV.

Although the FIG. 1a and FIG. 1b embodiments are believed preferred, it will be appreciated by those skilled in the art that a device can also be made which does not use hole-injection layer 103, hole transport layer 104, and electron-transport layer 106. Those skilled in the art will appreciate that the emissive layer can be selected to include hole-transport and electron-transport functions and the anode layer can function as the hole-injection layer. In such an instance, the device requires emissive layer 105 and does not require layers 103, 104, and 106.

EXAMPLES

In the following examples, reference should be made to Table 1 for the appropriate functions of layers corresponding to the listed acronym. The substrates used were ITO coated glass upon which the layers comprising the OLEDs were deposited. In Tables 2 through 5 presented are the structure, layer thickness, and performance of the devices. The HTL and EML/ETL were deposited using a vacuum coater in a single pump-down run. These samples were then transferred to a Plasmatron multifunction deposition system (having the capability of coating by resistive and e-beam heating as well as by sputtering without breaking vacuum) where all the remaining layers were deposited. Finally, the devices were hermetically encapsulated in a glove box filled with dry nitrogen. The luminance of the devices was measured using a Photo Research PR 650 spectrophotometer as a function of current. The luminance, L (cd/m²), of the devices shown in Tables 2 through 5 refers to that when a current corresponding to 20 mA/cm² is driven through the device, and eV (electron volts) is the drive voltage under this condition after accounting for voltage drop due to ITO resistance. The reflectivity of the devices was measured through the substrate using Filmetrics F 20, a thin film measurement system. Prior to measurement, the instrument was calibrated using a single crystal Si wafer as a standard. The reflectivity values given in the Tables are for 525 nm, which is approximately the wavelength of Alq emission.

Figure 2:
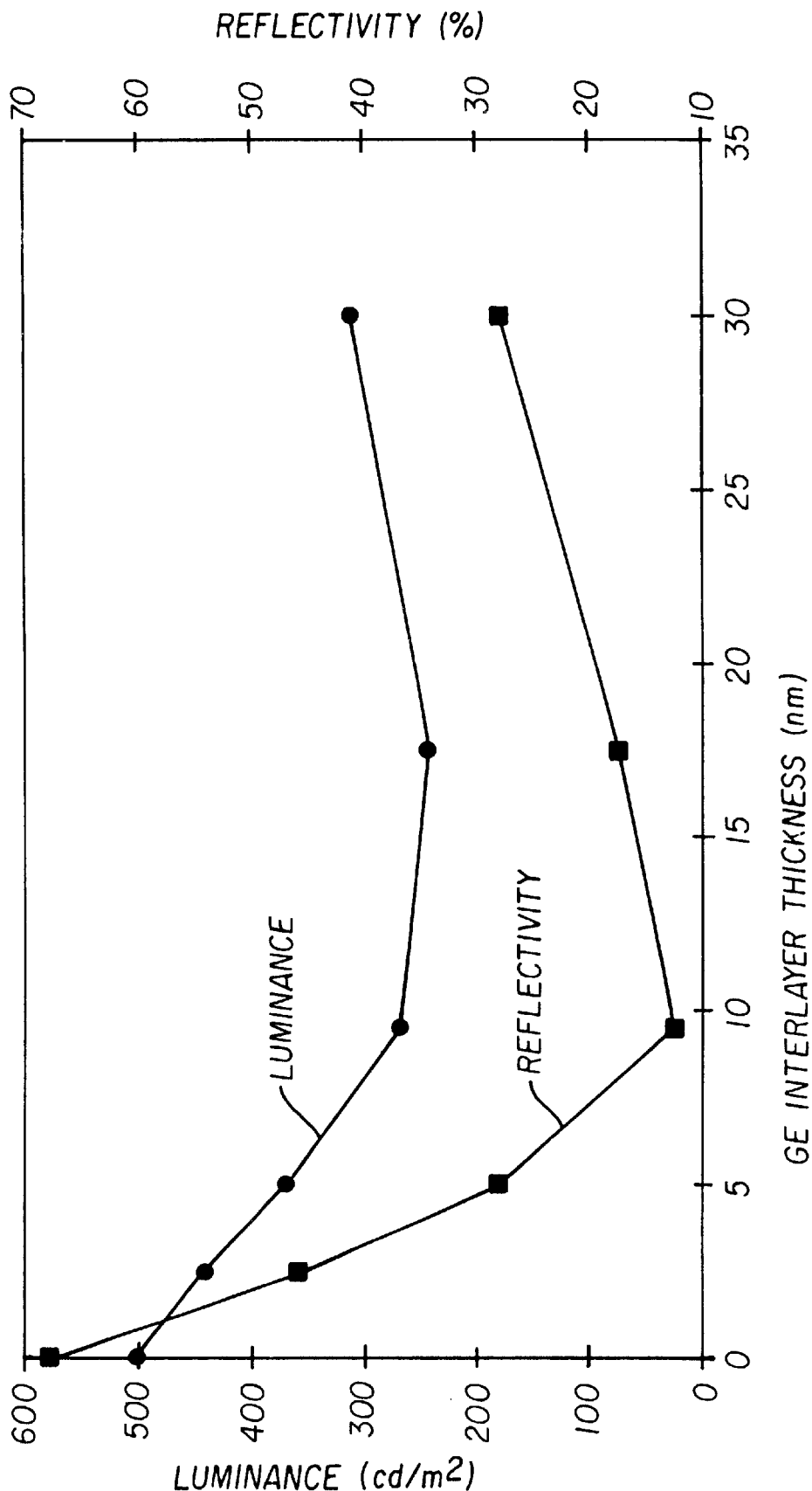
FIG. 2 is a graph of luminance and reflectivity vs. interlayer thickness.
Figure 3:
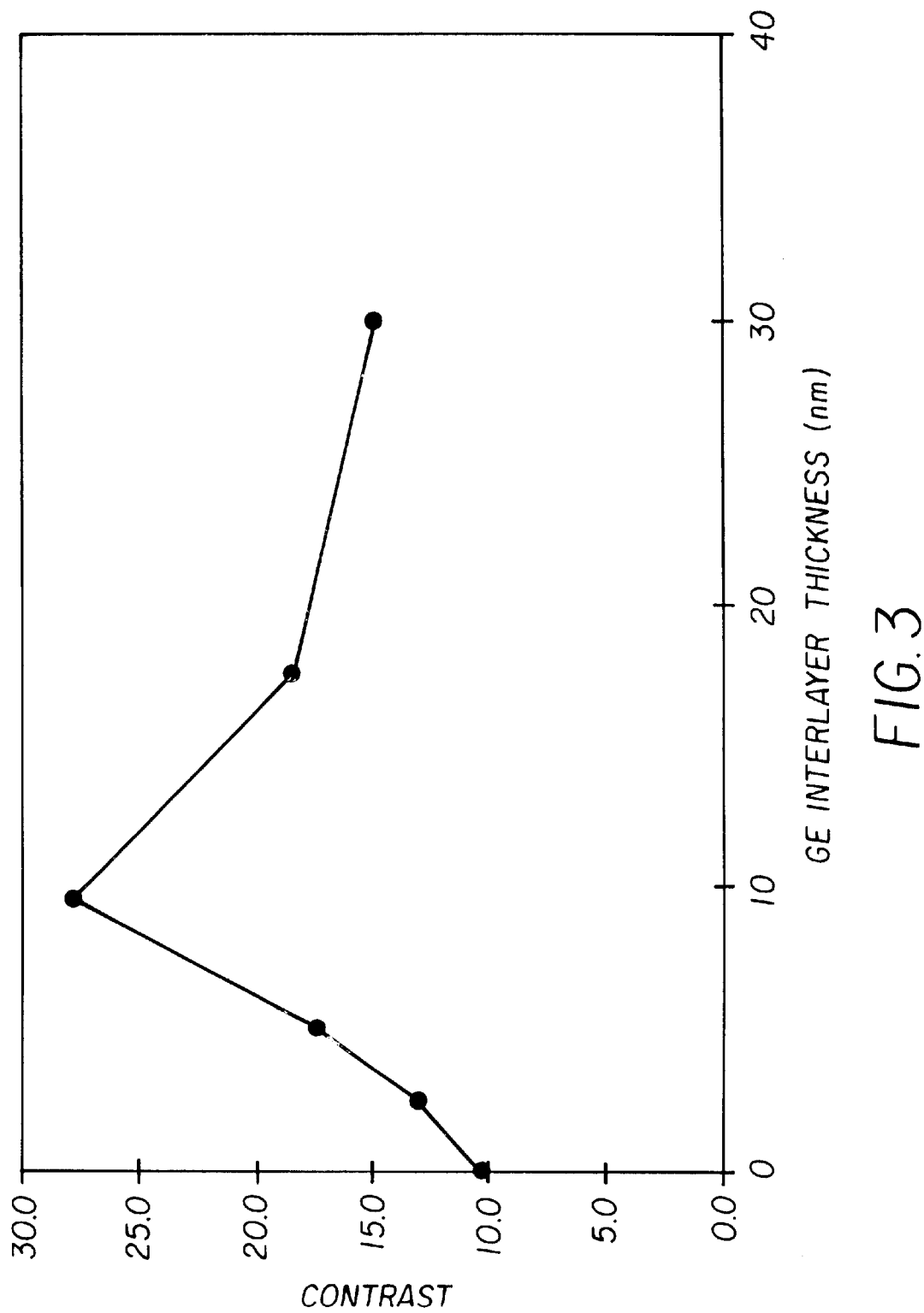
FIG. 3 is a graph of contrast vs. interlayer thickness.

The contrast, C, defined here as the ratio of light effectively emitted when the device is active to that when the device is switched off, is calculated using the relation:

$$C=(L_e+L_aR)/L_aR,$$

where $L_e$ is the luminance of the device in total darkness, $L_a$ is the ambient light intensity and R is the device reflectance.

injecting layer 107 should be at least 25% at the wavelength (s) of interest. The reflective layer for these devices was a thermally evaporated layer of Ag. It can be easily seen from Table 2 and FIG. 2 that the device reflectivity, initially decreasing with increasing Ge interlayer thickness, reaches to its minimum value of 12.6% at about 9.5 nm before increasing with interlayer thickness. The interlayer thickness is selected to be between 3 and 30 nm to lower the device reflectivity and increase the contrast. However, as shown in FIG. 3, a thickness in the range of between 6 and 12 nm has been found to be quite desirable in increasing the contrast. It is also noted in Table 2 that that the control and all reduced reflectivity devices (hereafter dark cathode devices) have approximately the same drive voltage, and the interlayer does not appear to have caused luminance lost by any mechanism other than through the reduction of device reflectivity. The luminance generally followed the device reflectivity as shown in FIG. 2. This is because of diminished contribution from dark electrode to total luminance. It is also to be noted that significant increase in contrast is not necessarily achieved as a result of reduction in reflectivity. For example, the device 101 in Table 2, which has more than 20-percentage point reduction in reflectivity, exhibits a contrast enhancement only by 30%. In the examples given in Table 2 it is observed that in order to increase the contrast by a factor about 2, the reflectivity reduction should be by a factor of much greater than 2.

TABLE 2

Structure, Layer Thickness and Performance of OLED Devices with Varying Interlayer Thickness

| Device ID | Anode ITO thickness (nm) | HIL CF$_x$ thickness (nm) | HTL NPB thickness (nm) | EML/ETL Alq thickness (nm) | Cathode LiF/Al thickness (nm)/(nm) | Interlayer Ge thickness (nm) | Reflector Metal thickness (nm) | Drive voltage (V) | Luminance (cd/m²) | Reflectance (%) | Contrast |
|---|---|---|---|---|---|---|---|---|---|---|---|
| 100 | 42 | 1 | 75 | 60 | 0.5/1.0 | 0 | Al 59 | 5.7 | 504 | 68.0 | 10 |
| 101 | 42 | 1 | 75 | 60 | 0.5/1.0 | 2.5 | Ag 50 | 5.6 | 444 | 46.0 | 13 |
| 102 | 42 | 1 | 75 | 60 | 0.5/1.0 | 5.0 | Ag 50 | 5.7 | 371 | 28.2 | 17 |
| 103 | 42 | 1 | 75 | 60 | 0.5/1.0 | 9.5 | Ag 50 | 6.0 | 271 | 12.6 | 28 |
| 104 | 42 | 1 | 75 | 60 | 0.5 /1.0 | 17.5 | Ag 50 | 6.1 | 245 | 17.5 | 19 |
| 105 | 42 | 1 | 75 | 60 | 0.5/1.0 | 30.0 | Ag 50 | 6.3 | 313 | 28.0 | 15 |

In Tables 2 through 5, the contrast shown are for ambient light intensity of 80 cd/m².

Example 1

In Table 2 shown are the structure, layer thickness, and performance of a set of devices made in one run. The device 100 is a standard device having a LiF/Al bilayer cathode comprising an e-beam evaporated Al layer on an ultrathin LiF film. All other devices, 101 through 105 were provided with a Ge interlayer between the ultrathin LiF/Al cathode and the reflective layer. The term ultrathin electron-injecting layer refers to an electron-injecting layer 107 (FIG. 1a) having a thickness in a range from 0.2 to 10 nm. Preferably, it has been determined that the range should be from appropriately from 1 to 5 nm. The electron-injecting layer 107 should be a low absorption layer, which means that some amount of light must pass through this layer. The term low absorption means that the transmittance of the electron- Example 2

In Table 3 shown are the structure, layer thickness, and performance of a set of devices made in another run. The Alq thickness was varied in this set giving rise to devices having different drive voltages. All the devices, 201 through 206, were provided with a fixed 10-nm thick Ge interlayer between the ultrathin LiF/Al cathode and a reflective layer. The reflective layer for the devices was sputtered from a Ag target. It can easily be seen that the device reflectivity has been lowered significantly by the interlayer. It is also to be noted that the reflectivity is not a strong function of Alq thickness. This implies that the approach is effective for low and high voltage devices although the interlayer thickness has to be selected for maximization of contrast.

TABLE 3

Structure, Layer Thickness and Performance of High-Contrast OLED Devices with Varying EML/ETL

| Device ID | Anode ITO thickness (nm) | HIL $CF_x$ thickness (nm) | HTL NPB thickness (nm) | EML/ETL Alq thickness (nm) | Cathode LiF/Al thickness (nm)/(nm) | Interlayer Ge thickness (nm) | Reflector Metal thickness (nm) | Drive voltage (V) | Luminance (cd/m$^2$) | Reflectance (%) | Contrast |
|---|---|---|---|---|---|---|---|---|---|---|---|
| 201 | 42 | 1 | 75 | 40 | 0.5/1.0 | 10 | Ag 60 | 4.4 | 221 | 13.8 | 21 |
| 202 | 42 | 1 | 75 | 50 | 0.5/1.0 | 10 | Ag 60 | 4.9 | 254 | 12.8 | 26 |
| 203 | 42 | 1 | 75 | 60 | 0.5/1.0 | 10 | Ag 60 | 5.7 | 250 | 12.0 | 27 |
| 204 | 42 | 1 | 75 | 70 | 0.5/1.0 | 10 | Ag 60 | 6.3 | 259 | 9.7 | 34 |
| 205 | 42 | 1 | 75 | 80 | 0.5/1.0 | 10 | Ag 60 | 7.0 | 234 | 8.2 | 37 |
| 206 | 42 | 1 | 75 | 90 | 0.5/1.0 | 10 | Ag 60 | 7.8 | 222 | 7.6 | 38 |

Example 3

In Table 4 shown are the structure, layer thickness and performance of another set of devices made in the same run. The cathode for the standard device was LiF/Al, bilayer, and those for the high contrast devices were ultrathin LiF/Y bilayers. The reflective layer for the device 302 was an e-beam evaporated Al layer, whereas the high-contrast device 303 was provided with sputtered Ag reflective layer. The devices 302 and 303 have identical organic and Ge interlayer, but the device 303 having the Ag reflective layer has lower reflectivity and higher contrast compared to device 302 having an Al reflective layer device 302.

TABLE 4

Structure, Layer Thickness and Performance of a Standard and High-Contrast Devices.

| Device ID | Anode ITO thickness (nm) | HIL $CF_x$ thickness (nm) | HTL NPB thickness (nm) | EML/ETL Alq thickness (nm) | Cathode thickness (nm)/(nm) | Interlayer Ge thickness (nm) | Reflector Metal & thickness (nm) | Drive voltage (V) | Luminance (cd/m$^2$) | Reflectance (%) | Contrast |
|---|---|---|---|---|---|---|---|---|---|---|---|
| 301 | 42 | 1 | 75 | 60 | 0.5/1 | 0 | Al 60 | 6.9 | 472 | 68.0 | 10 |
| 302 | 42 | 1 | 75 | 60 | 0.5/1.5 | 9.5 | Al 60 | 8.9 | 327 | 29.1 | 15 |
| 303 | 42 | 1 | 75 | 60 | 0.5/1.5 | 9.5 | Ag 60 | 8.6 | 221 | 11.0 | 26 |

Example 4

In Table 5 shown are the structure, layer thickness and performance of another set of devices made in the same run. Here again, the cathode for a conventional device 401 is a LiF/Al bilayer. The Ge interlayer thickness was varied within the series. The interlayer, however, was deposited directly on the ETL of devices 402 through 404. The cathodes for these devices were formed by sputtering on ETL a silver alloy containing 4-w % Li. Although the drive voltages of these devices are higher than that of the standard devices, presumably due to their relatively inefficient electron injection efficiencies, lower device reflectivity and higher contrast are achieved when the Ge interlayers are incorporated.

TABLE 5

Structure, Layer Thickness and Performance of a Standard and High-Contrast Devices

| Device ID | Anode ITO thickness (nm) | HIL CF$_x$ thickness (nm) | HTL NPB thickness (nm) | EML/ETL Alq thickness (nm) | Interlayer Ge thickness (nm) | Cathode/ Reflector thickness (nm) | Drive voltage (V) | Luminance (cd/m$^2$) | Reflectance (%) | Contrast |
|---|---|---|---|---|---|---|---|---|---|---|
| 401 | 42 | 1 | 75 | 60 | 0.0 | LiF 0.5/ Al 60 | 5.4 | 517 | 69.0 | 10 |
| 402 | 42 | 1 | 75 | 60 | 5.0 | Ag:Li 60 | 6.4 | 331 | 31.0 | 14 |
| 403 | 42 | 1 | 75 | 60 | 9.5 | Ag:Li 60 | 6.3 | 252 | 14.0 | 24 |
| 404 | 42 | 1 | 75 | 60 | 15.0 | Ag:Li 60 | 6.6 | 221 | 16.0 | 18 |

Tables 2 through 5 show the benefit of including a thin interlayer in the OLED structure. The drive voltage stayed nearly the same but the reflectivity is reduced significantly resulting in a three-fold increase in contrast.

The invention has been described in detail with particular reference to certain preferred embodiments thereof, but it will be understood that variations and modifications can be effected within the spirit and scope of the invention.

PARTS LIST 100 organic light-emitting diode device
101 substrate
102 anode
103 hole-injection layer
104 hole transport layer
105 emissive layer
106 electron-transport layer
107 electron-injecting layer
108 interlayer
109a reflective layer
109b reflective layer
110 voltage source
111 conductors

What is claimed is:

1. An OLED device for providing increased contrast, comprising:
    a) a transparent substrate;
    b) an anode formed of a transparent conductive material over the substrate;
    c) an emissive layer having an electroluminescent material provided over the anode layer;
    d) an electron-transport layer disposed over the emissive layer and an ultrathin low absorption electron-injecting layer over the electron-transport layer;
    e) an interlayer including semi-metal, metal, metal alloy or an intermetallic compound disposed over the utrathin low absorption electron-injecting layer;
    f) a layer of reflective mat rial provided over the interlayer; and
    g) wherein the interlayer thickness is selected to cause an increase in contrast compared to the OLED de vice if no interlayer was provided.

2. An OLED device for providing increased contrast, comprising:
    a) a transparent substrate;
    b) an anode formed of a transparent conductive material over the substrate;
    c) hole-injection and hole-transport layers respectively formed over the anode;
    d) an emissive layer form(d over the hole-transport layer and including an electroluminescent material;
    e) an electron-transport layer formed over the emissive layer;
    f) an ultrathin low absorption electron-injecting layer over the electron-transport layer;
    g) an interlayer including semi-metal, metal, metal alloy or an intermetallic compound disposed over the ultrathin low-absorption electron-injecting layer;
    h) a layer of reflective material provided over the interlayer; and
    i) wherein the interlayer thickness is selected to cause an increase in contrast compared to the OLED device if no interlayer was provided.

3. An OLED device for providing increased contrast, comprising:
    a) a transparent substrate;
    b) an anode formed of a transparent conductive material over the substrate;
    c) an emissive layer formed over the substrate and including an electroluminescent material;
    d) an interlayer provided over the emissive layer including a semi-metal, metal, metal alloy of an intermetallic compound;
    e) a layer of reflective material provided over the interlayer; and
    f) wherein the reflective layer is doped with an electron-injecting dopant which migrates sufficiently to provide an electron-injecting connection between the reflecting layer and the emissive layer and wherein the interlayer thickness is selected to cause an increase in contrast compared to the OLED device if no interlayer was provided.

4. An OLED device for providing increased contrast, comprising:
    a) a transparent substrate;
    b) an anode formed of a transparent conductive material over the substrate;
    c) hole injection and hole-transport layers respectively formed over the anode;
    d) an emissive layer formed over the hole-injecting layer and including an electroluminescent material;
    e) an electron-transport layer formed over the emissive layer;
    f) an interlayer including a semi-metal, metal, metal alloy or an intermetallic compound disposed between the reflective layer and the electron-transport layer;

g) a layer of reflective material provided over the interlayer; and h) wherein the reflective layer is doped with an electron-injecting dopant which migrates sufficiently to provide an electron-injecting connection between the reflecting layer and the transport layer and wherein the interlayer thickness is selected to cause an increase in contrast compared to the OLED device if no interlayer was provided.

5. The OLED device of claim 1 wherein the interlayer includes Ge, Se, Te, GeTe, W, Mo, Ta or alloys thereof.

6. The OLED device of claim 2 wherein the interlayer includes Ge, Se, Te, GeTe, W, Mo, Ta or alloys thereof.

7. The OLED device of claim 3 wherein the interlayer includes Ge, Se, Te, GeTe, W, Mo, Ta or alloys thereof.

8. The OLED device of claim 1 wherein the interlayer has a thickness selected to be in a range of 3.0 to 30 nm.

9. The OLED device of claim 2 wherein the interlayer has a thickness selected to be in a range of 3.0 to 30 nm.

10. The OLED device of claim 3 wherein the interlayer has a thickness selected to be in a range of 3.0 to 30 nm.

11. The OLED device of claim 1 wherein the reflective material in the layer of reflective material is Au, Ag, Cu, Al and alloys thereof.

12. The OLED device of claim 2 wherein the reflective material in the layer of reflective material is Au, Ag, Cu, Al and alloys thereof.

13. The OLED device of claim 3 wherein the reflective material in the layer of reflective material contains an alkaline or alkaline earth metal.

14. The OLED device of claim 1 wherein the electron-injecting layer has a thickness in the range of 0.2 to 10 nm.

15. The OLED device of claim 2 wherein the electron-injecting layer has a thickness in the range of 0.2 to 10 nm.

16. The OLED device of claim 1 wherein the electron-injecting layer has a work function between 2 and 4 eV.

17. The OLED device of claim 2 wherein the electron-injecting layer has a work function between 2 and 4 eV.

18. The OLED device of claim 1 wherein the electron-injecting layer includes a LiF/Al bilayer structure.

19. The OLED device of claim 2 wherein the electron-injecting layer includes a LiF/Al bilayer structure.

20. The OLED device of claim 1 wherein the electron-injecting layer includes a LiF/Y bilayer structure.

21. The OLED device of claim 2 wherein the electron-injecting layer includes a LiF/Y bilayer structure.

22. The OLED device of claim 1 wherein the emissive layer includes Alq.

23. The OLED device of claim 1 wherein the emissive layer contains one or more light emitting doped materials.

24. A method of making an OLED device for providing increased contrast, comprising the steps of:

a) providing a transparent substrate and a reflective layer spaced from the transparent layer;

b) providing an anode formed of a transparent conductive material over the substrate;

c) providing an emissive layer having an electroluminescent material provided over the anode layer;

d) providing an interlayer between the reflective layer and the emissive layer, such interlayer includes a semi-metal, metal, metal alloy or an intermetallic compound; and e) providing electron injection to the emissive layer by depositing an ultrathin electron-injecting layer between the interlayer and the emissive layer or by providing dopant, including an alkaline or alkaline earth metal, in the reflective layer which migrates sufficiently to provide an electron-injecting connection between the reflecting layer and the emissive layer.

* * * * *